United States Patent
Oae et al.

(10) Patent No.: US 8,281,794 B2
(45) Date of Patent: Oct. 9, 2012

(54) STAGE DEVICE AND STAGE CLEANING METHOD

(75) Inventors: Yoshihisa Oae, Tokyo (JP); Youichi Shimizu, Tokyo (JP)

(73) Assignee: Advantest Corp., Tokyo (JP)

( * ) Notice: Subject to any disclaimer, the term of this patent is extended or adjusted under 35 U.S.C. 154(b) by 114 days.

(21) Appl. No.: 12/799,675

(22) Filed: Apr. 29, 2010

(65) Prior Publication Data

US 2010/0236576 A1 Sep. 23, 2010

Related U.S. Application Data

(63) Continuation of application No. PCT/JP2009/055630, filed on Mar. 23, 2009.

(51) Int. Cl.
*B08B 3/00* (2006.01)
(52) U.S. Cl. .................... 134/147; 134/56 R; 134/58 R; 134/137; 134/184; 15/3
(58) Field of Classification Search ......................... None
See application file for complete search history.

(56) References Cited

U.S. PATENT DOCUMENTS

| 2007/0034228 A1 | 2/2007 | Devitt |
| 2007/0252969 A1 | 11/2007 | Ueno |

FOREIGN PATENT DOCUMENTS

| EP | 1262835 A2 | 12/2002 |
| JP | 2001-153140 | 6/2001 |
| JP | 2002-349568 | 12/2002 |
| JP | 2002-349569 | 12/2002 |
| JP | 2006-66589 | 3/2006 |
| WO | WO 2007/069713 | 6/2007 |
| WO | WO 2007/108399 | 9/2007 |

*Primary Examiner* — Eric Golightly
(74) *Attorney, Agent, or Firm* — Muramatsu & Associates

(57) ABSTRACT

A stage device for use in a vacuum includes a frame-shaped movable stage having a sample mounting surface, a fixed stage surrounded by the movable stage, an air bearing to float the movable stage by supplying gas to a gap between the stages, a pressure regulator to regulate a pressure of the gas, a differential pumping portion to prevent the gas from flowing outside the gap, and a controller. The controller moves the movable stage within a predetermined range under a pressure in the differential pumping portion set equal to that for movable stage in use when setting a floating height of the movable stage lower than that for movable stage in use, and under the pressure in the differential pumping portion set higher than that for movable stage in use when setting the floating height of the movable stage equal to that for movable stage in use.

6 Claims, 12 Drawing Sheets

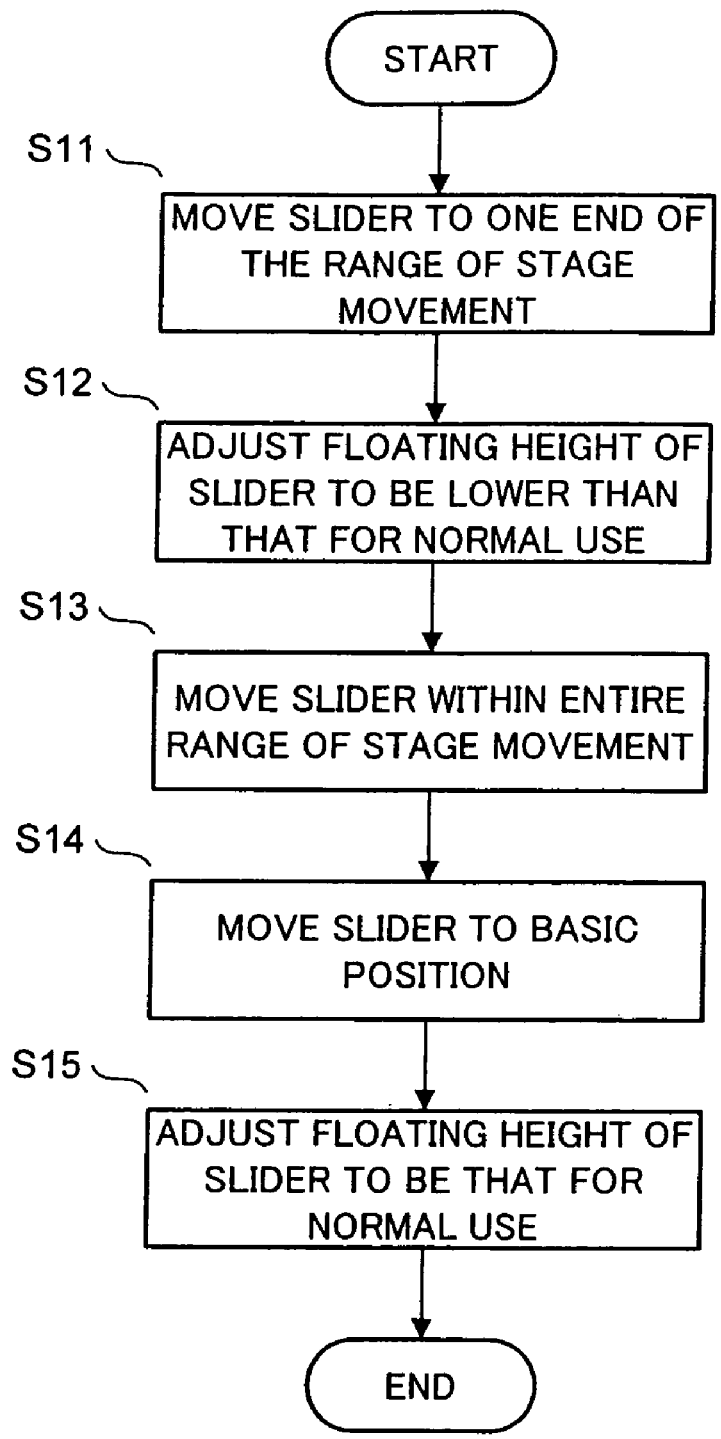

STAGE DEVICE AND STAGE CLEANING METHOD

CROSS-REFERENCE TO RELATED APPLICATIONS

This application is a continuation of prior International Patent Application No. PCT/JP2009/055630, filed Mar. 23, 2009, the entire contents of which are incorporated herein by reference.

BACKGROUND OF THE INVENTION

1. Field of the Invention

The present invention relates to a stage device and a stage cleaning method. In particular, the present invention relates to a stage device having a function of efficiently cleaning a track surface of a sample stage using an air bearing in a vacuum in an electron beam exposure system or the like, and a method of cleaning a stage of the same.

2. Description of the Prior Art

In electron beam exposure systems and electron microscopes, a sample is exposed, observed, or measured while being mounted on a stage. For example, an electron beam exposure system performs exposure while moving a stage in accordance with exposure data so that a required position on a wafer may be exposed.

Such stages include cross roller bearing stages. In cross roller bearing stages, rollers in a track between a movable stage and a fixed stage revolve to move the movable stage. When such stages are in use, oil for vacuum devices is applied to a track and rollers for the lubrication of the track and the prevention of particle generation.

When such a stage with a mechanical bearing is used in a state where a particle exists on a track, the particle causes strain in the stage mechanism. Such strain degrades the operation of stage position detection, and makes it difficult to detect a stage position accurately. A particle does not remain at a certain place on the track but moves as the stage moves. This phenomenon hinders replication of the position change of the stage and prediction of a position to which the stage is moved. Thus, the stage mechanism has difficulty in correcting the position of the stage. Further, in the case where oil is applied to the track, particles can be removed to a certain extent while the oil exists, but the amount of particles may rapidly increase when the oil is lost.

In contrast to such stages using mechanical bearings, technologies using air bearings have been studied and used. For example, Japanese Patent Application No.2006-66589 describes a stage device in an exposure system for use in photolithography. In the stage device, a movable member is supported on a base member in a noncontact manner using a fluid bearing (gas bearing or air bearing).

When such an air bearing is used, the degradation of accuracy of a stage caused by particles on the track of the stage can be reduced compared to when a mechanical bearing is used.

However, the stage device is not necessarily always able to prevent degradation of accuracy of the stage for any-sized particles. For example, in the case where there is a particle of a size approximately equal to the height of the noncontact portion, the particle may be entangled when the stage is moved, and the fixed member and the movable member may come into contact with each other. When such a situation arises, the attitude of the stage mounted on the movable member becomes unstable. This results in accuracy degradation.

It should be noted that no techniques have been reported for removing particles in the case where a stage is moved using an air bearing mechanism in a vacuum.

SUMMARY OF THE INVENTION

The present invention has been made in view of the above-described problems in the prior art. An object of the present invention is to provide a stage device and a stage cleaning method which enable to efficiently remove the particles present on a track of a stage using an air bearing in a vacuum.

To achieve the above-described problem in the conventional art, according to a basic embodiment, a stage device for use in an electron beam exposure system includes: a gas supply unit to generate gas; a pressure regulator to regulate a pressure of the gas; a frame-shaped movable stage having a sample mounting surface; a fixed stage having a surface facing an opposite surface of the movable stage from the sample mounting surface, the fixed stage being surrounded by the movable stage; an air bearing to float the movable stage by supplying the gas to a gap portion between the fixed stage and the movable stage; a differential pumping portion to prevent the gas from flowing outside the gap portion between the movable stage and the fixed stage; and a controller to control the gas supply unit, the pressure regulator, the movable stage, and the differential pumping portion in a cleaning operation and an electron beam exposure operation, wherein the controller performs the cleaning operation on a track of the air bearing by moving the movable stage within a predetermined range under a pressure in the differential pumping portion set equal to that for the movable stage in use for the electron beam exposure operation when a floating height of the movable stage is set lower than that for the movable stage in use for the exposure operation, and by moving the movable stage within a predetermined range under the pressure in the differential pumping portion set higher than that for the movable stage in use for the electron beam exposure operation when the floating height of the movable stage is set equal to that for the movable stage in use for the exposure operation.

According to the embodiment, the stage device further includes: an interferometer to detect a position of the movable stage, wherein, in the cleaning operation, the controller may move the movable stage to a predetermined position, set the floating height of the movable stage lower than that for the movable stage in use for the electron beam exposure operation, measure rolling and pitching of the movable stage, and determine that a particle exists on the track of the air bearing if a value of any of the rolling and pitching exceeds a predetermined value. The stage device further includes: a vertical position detector to detect a vertical position of the movable stage, wherein, in the cleaning operation, the controller may move the movable stage to a predetermined position, set the floating height of the movable stage lower than that for the movable stage in use for the electron beam exposure operation, detect a change in the vertical position of the movable stage with respect to a change in a pressure for supplying the gas, and determine that a particle exists on the track of the air bearing if the change in the vertical position is out of a predetermined allowable value range.

Further, in the stage device according to the embodiment, the controller may move the movable stage from one end of the fixed stage to an opposite end of the fixed stage at least once and reciprocate the movable stage with a short stroke of 10 µm or less around the predetermined position twice or more.

Additionally, according to another embodiment, there is provided a stage cleaning method for the stage device. The stage cleaning method for a stage device for use in a vacuum, the stage device including: a gas supply unit to generate gas; a pressure regulator to regulate a pressure of the gas; a frame-shaped movable stage having a sample mounting surface; a fixed stage having a surface facing an opposite surface of the movable stage from the sample mounting surface, the fixed stage being surrounded by the movable stage; an air bearing to float the movable stage by supplying the gas to a gap portion between the fixed stage and the movable stage; and a differential pumping portion to prevent the gas from flowing outside the gap portion between the movable stage and the fixed stage, the method including the steps of: regulating a floating height of the movable stage and a pressure in the differential pumping portion; and moving the movable stage within a predetermined range while maintaining the floating height of the movable stage and the pressure in the differential pumping portion.

In the stage cleaning method according to the another embodiment, the step of regulating the floating height and the pressure in the differential pumping portion may include the steps of: adjusting the pressure in the differential pumping portion to a pressure equal to that for the movable stage for normal use of the stage (i.e., electron beam exposure operation) when the floating height is set lower than that for the movable stage in the normal use; and adjusting the pressure in the differential pumping portion to a pressure higher than that for the movable stage in the normal use when the floating height is set equal to that for the movable stage in the normal use, may include before the step of adjusting the floating height and the pressure in the differential pumping portion, the steps of: moving the movable stage to a predetermined position; setting the floating height of the movable stage lower than that for the movable stage in the normal use and measuring rolling and pitching of the movable stage; and determining that a particle exists on a track of the air bearing if any of the rolling and pitching exceeds a predetermined allowable value, and further may include before the step of regulating the floating height and the pressure in the differential pumping portion, the steps of: moving the movable stage to a predetermined position; setting the floating height of the movable stage lower than that for the movable stage in the normal use and measuring a vertical position of the movable stage; and determining that a particle exists on a track of the air bearing if a change in the vertical position with respect to a change in a pressure for supplying the gas is out of a predetermined allowable value range.

In the stage cleaning method according to the another embodiment, the step of moving the movable stage within the predetermined range may includes the steps of: moving the movable stage to one end of the fixed stage; and moving the movable stage to an opposite end of the fixed stage, and may be the step of reciprocating the movable stage with a short stroke of 10 μm or less around a predetermined position twice or more.

In the stage device and stage cleaning method of the present invention, the air supplied to the air bearing is regulated so that the width of the gap between the movable stage and the fixed stage becomes smaller than that for the normal use, and the movable stage is moved within the entire range of the track thereof.

Further, stage cleaning is performed by moving the movable stage throughout the entire range of the track thereof with the width of the gap between the movable stage and the fixed stage being set to a width for normal use and with the pressure on the differential pumping portion of the air bearing being increased.

These make it possible to remove particles present on the track of the movable stage.

Moreover, the pitching and rolling of the movable stage are detected at predetermined positions with the width of the gap between the movable stage and the fixed stage being narrowed by regulating air supplied to the air bearing. When the pitching or rolling of the movable stage is detected, stage cleaning is performed.

Thus, stage cleaning needs to be carried out only when necessary, and efficient stage cleaning can be performed.

BRIEF DESCRIPTION OF THE DRAWINGS

FIG. 5 is a flowchart (part 1) showing one example of a stage cleaning process for the sample stage device;

DESCRIPTION OF THE PREFERRED EMBODIMENTS (1) First Embodiment

Hereinafter, embodiments of the present invention are described with reference to the drawings. First, the configuration of an electron beam exposure system and a stage device is described with reference to FIGS. 1 to 3C. Next, a method of cleaning particles present on the track of a sample stage is described with reference to FIGS. 4A to 5. It should be noted that though the following is described by taking the case where a stage device is used in an electron beam exposure system, the present invention is not limited to this case. It is a matter of course that the present invention can be applied to other vacuum devices, e.g., a stage for an electron microscope.

(Configurations of Electron Beam Exposure System and Stage Device)

Figure 1:
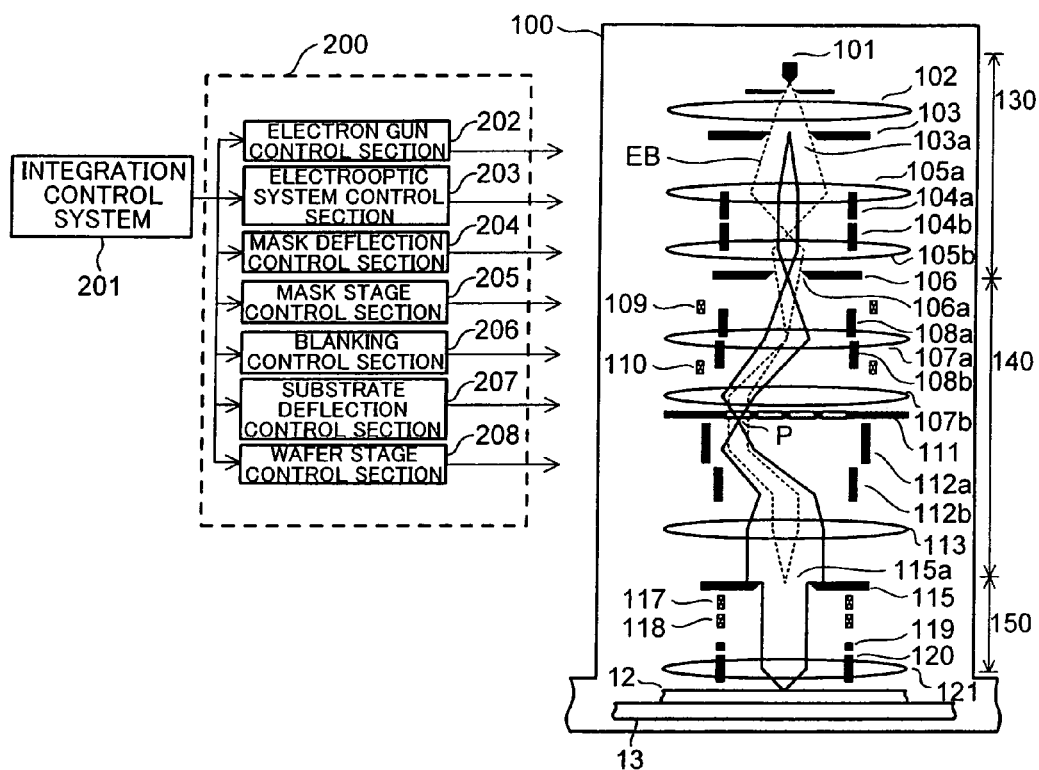
FIG. 1 is a diagram showing the configuration of an electron beam exposure system.

FIG. 1 is a schematic diagram showing the configuration of an electron beam exposure system including a stage device according to this embodiment.

The electron beam exposure system is broadly divided into an exposure unit 100 and a digital controller 200 to control the exposure unit 100. The exposure unit 100 includes an electron beam generation section 130, a mask deflection section 140, and a substrate deflection section 150.

In the electron beam generation section 130, an electron beam EB generated in an electron gun 101 is subjected to the converging action of a first electromagnetic lens 102, and then passes through a rectangular aperture 103a (first opening) of a beam-shaping mask 103. As a result, the electron beam EB is shaped to have a rectangular cross section.

The electron beam EB shaped into a rectangular shape is imaged onto a second beam-shaping mask 106 by a second electromagnetic lens 105a and a third electromagnetic lens 105b. The electron beam EB is also deflected by a first and second electrostatic deflectors 104a and 104b for variable rectangular shaping and passes through a rectangular aperture 106a (second opening) of the second beam shaping mask 106. The electron beam EB is shaped by the first and second openings.

Then, the electron beam EB is imaged onto a stencil mask 111 by a fourth electromagnetic lens 107a and a fifth electromagnetic lens 107b in the mask deflection section 140. The electron beam EB is also deflected by third and fourth electrostatic deflectors 108a and 108b (also referred to as first and second selective deflectors, respectively) toward a specific pattern P formed in the stencil mask 111, and the cross-sectional shape of the electron beam EB is shaped into the shape of the pattern P. The pattern is also referred to as a character projection (CP) pattern. The electron beam EB is bent to be incident on the stencil mask 111 parallel to the optical axis by the deflector 108b disposed near the fifth electromagnetic lens 107b.

Incidentally, while the stencil mask 111 is fixed to a mask stage, the mask stage is movable in a horizontal plane. For the purpose of using a pattern P located outside the deflection range (beam deflection region) of the third and fourth electrostatic deflectors 108a and 108b, the mask stage is moved so that the pattern P may enter the beam deflection region.

A sixth electromagnetic lens 113 disposed under the stencil mask 111 has a role to make the electron beam EB parallel near a shield 115 by the amount adjustment of the current flowing into the sixth electromagnetic lens 113.

The electron beam EB which has passed through the stencil mask 111 is bent back to the optical axis by the deflecting actions of fifth and sixth electrostatic deflectors 112a and 112b (also referred to as first and second bending back deflectors, respectively). The electron beam EB is bent by the deflector 112b disposed near the sixth electromagnetic lens 113 to be returned to the axis and then travel along the axis.

The mask deflection section 140 includes first and second correction coils 109 and 110 which correct beam deflection aberration produced by the first to sixth electrostatic deflectors 104a, 104b, 108a, 108b, 112a, and 112b.

Then, the electron beam EB passes through an aperture 115a (round aperture) of the shield 115 partially constituting the substrate deflection section 150, and is projected onto a substrate by an electromagnetic projection lens 121. Thus, an image of the pattern of the stencil mask 111 is transferred onto the substrate at a predetermined reduction ratio, e.g., a reduction ratio of 1/10.

The substrate deflection section 150 includes seventh and eighth electromagnetic deflectors 119 and 120 which deflect the electron beam EB so that an image of the pattern of the stencil mask 111 is projected onto a predetermined position on the substrate.

The substrate deflection section 150 further includes third and fourth correction coils 117 and 118 to correct the deflection aberration of the electron beam EB on the substrate.

The digital controller 200 includes an electron gun control section 202, an electrooptic system control section 203, a mask deflection control section 204, a mask stage control section 205, a blanking control section 206, a substrate deflection control section 207, and a wafer stage control section 208. The electron gun control section 202 controls the electron gun 101 to control the acceleration voltage, beam irradiation conditions, and the like of the electron beam EB. The electrooptic system control section 203 controls parameters such as the amounts of currents flowing into the electromagnetic lenses 102, 105a, 105b, 107a, 107b, 113, and 121 to adjust the magnifications, focal point positions, and the like of electrooptic systems constituting these electromagnetic lenses. The blanking control section 206 controls the voltage applied to a blanking deflector to deflect the electron beam EB, which has been being generated before the start of exposure, onto the shield 115. As a result, the blanking control section 206 prevents the electron beam EB from being applied onto the substrate before exposure.

The substrate deflection control section 207 controls the voltages applied to the seventh and eighth electrostatic deflectors 119 and 120 to deflect the electron beam EB onto a predetermined position on the substrate. The wafer stage control section 208 moves a substrate 12 in a horizontal direction by adjusting a drive amount of an actuator 125 so that the electron beam EB may be applied to a desired position on the substrate 12. The above-described sections 202 to 208 are comprehensively controlled by an integration control system 201 such as a workstation.

Figure 2:
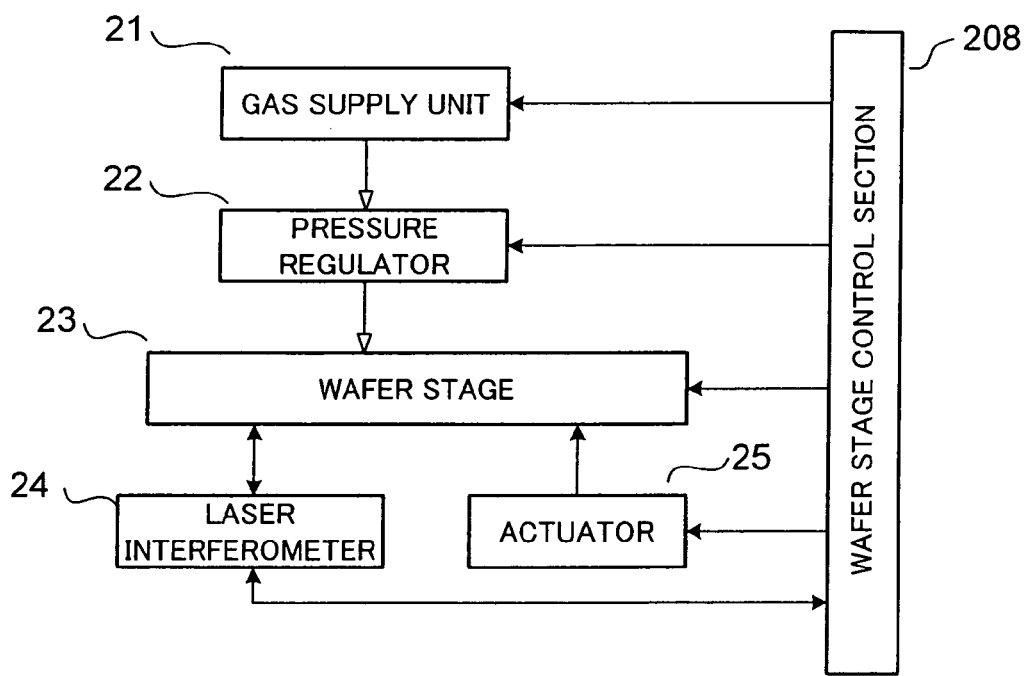
FIG. 2 is a block diagram showing the configuration of a sample stage device of an exposure system according to FIG. 1.

FIG. 2 is a block diagram showing the configuration of the stage device, on which a sample is mounted, in the exposure system. The stage device basically includes a gas supply unit 21, a pressure regulator 22, a wafer stage 23, laser interferometers 24, the actuator 25, and the wafer stage control section 208.

The gas supply unit 21 generates and sends out clean dry air (CDA).

The pressure regulator 22 is provided at a certain position in a gas flow path to connect the gas supply unit 21 and a supply port of an air bearing of the wafer stage 23, and adjusts the pressure of gas to be supplied to the air bearing. The pressure regulator 22 is configured to include an electropneumatic regulator which adjusts the pressure of gas and ejects the gas at a set pressure.

The laser interferometers 24 are disposed at positions facing a side surface of the wafer stage 23 and a side surface thereof perpendicular to the foregoing side surface, and measure the position of the wafer stage 23 and the attitude (pitching, rolling, and yawing) of the wafer stage 23 in two perpendicular directions. A laser interferometer 24 is also provided above the wafer stage 23 to be used in measuring the vertical position of the wafer stage 23.

The wafer stage control section 208 controls the gas supply unit 21, the pressure regulator 22, and the laser interferometers 24 to detect the position of the wafer stage 23 with high accuracy. In particular, in the present invention, as described later, various kinds of control are performed by adjusting the pressure of air supplied to the air bearing of the wafer stage 23 so that particles present on the wafer stage 23 may be removed.

Figure 3A:
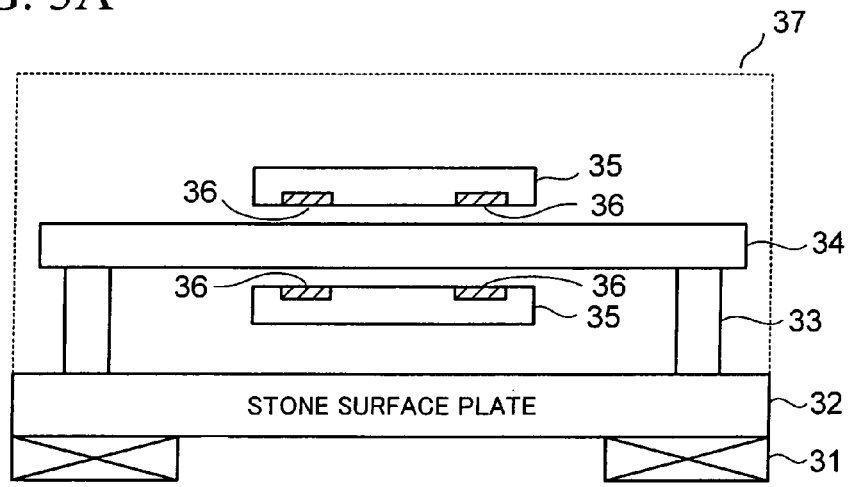
FIGS. 3A to 3C are schematic diagrams showing the configuration of a principal part, in which an air bearing is used, of the sample stage device.
Figure 3B:
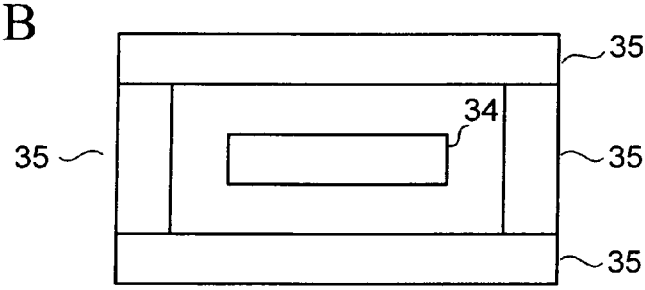
Figure 3C:
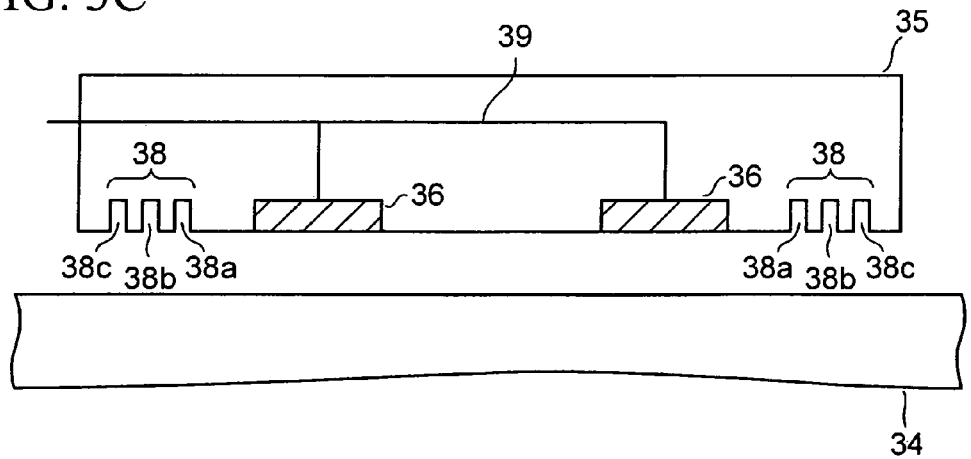

FIGS. 3A to 3C are schematic diagrams showing the configuration of a principal part of a stage, which uses an air bearing, of a sample stage device where FIG. 3A is a front view, FIG. 3B is a side view, and FIG. 3C is an enlarged front view, respectively, of the principal part.

The sample stage includes a slider (movable stage) 35 and a square shank (fixed stage) 34 which are disposed in a vacuum sample chamber 37. The movable stage 35 is configured in the form of a frame to surround the fixed stage 34 as shown in FIG. 3B, and moves along the fixed stage 34. The fixed stage 34 is disposed on a stone surface plate 32 placed on vibration isolation mounts 31, with support rods 33 interposed therebetween.

FIG. 3C shows an enlarged view of the movable stage 35. The movable stage 35 basically includes air pads 36 and a differential pumping portion 38. The air pads 36 are used to emit to the fixed stage 34 air sent from the gas supply unit 21 through piping 39. The differential pumping portion 38 adjusts the pressure of the emitted air so that the emitted air may not flow outside a gap portion between the movable stage 35 and the fixed stage 34.

The air pads 36 are made of, for example, an aluminum ceramic or a zirconia ceramic, and have openings which determine the distribution of air.

The pressure of air supplied to the air pads 36 is, for example, 0.5 [MPa]. By emitting the air toward the fixed stage 34, the movable stage 35 is floated.

The differential pumping portion 38 has exhaust channels 38a, 38b, and 38c. By discharging air through the exhaust channels 38a, 38b, and 38c, the pressure of air is gradually reduced outward from the gap portion. For example, the air pressure is set to 0.1 [MPa], 400 [Pa], and 1 [Pa] for the exhaust channels 38a, 38b, and 38c, respectively. As a result, the flow of outside air becomes 0.0001 [L/min]. Thus, a state in which air hardly flows is obtained, and a vacuum state can be maintained.

Figure 4A:
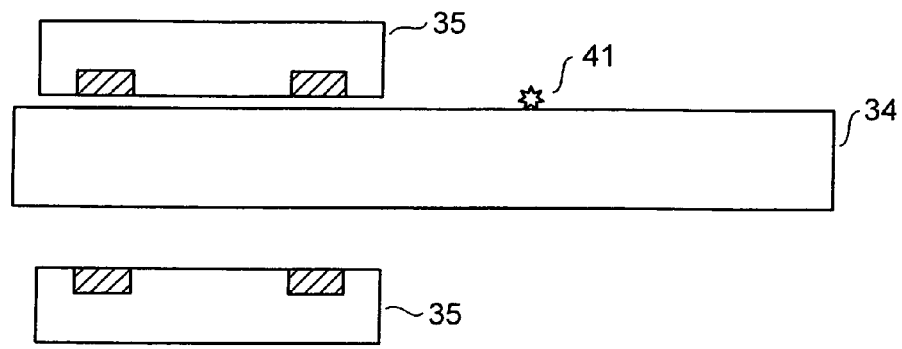
FIGS. 4A to 4C are views (part 1) for explaining cleaning on the track of the sample stage device.
Figure 4B:
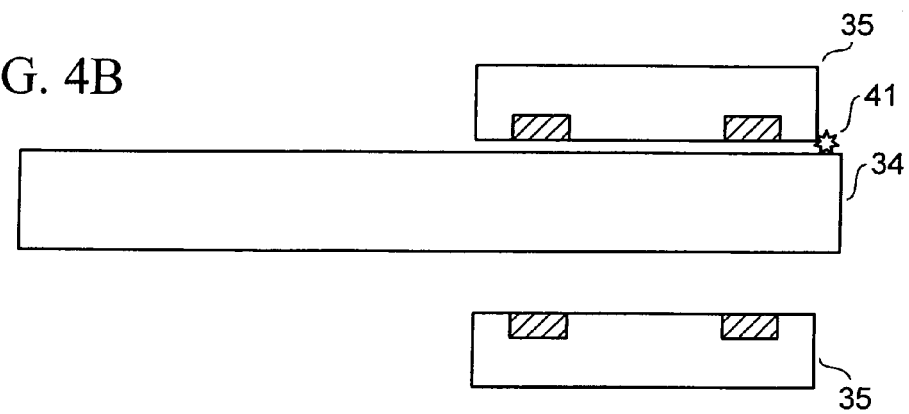
Figure 4C:
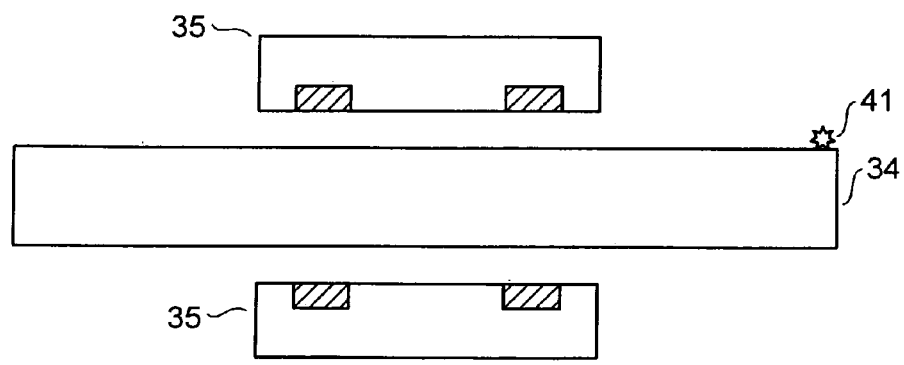

FIGS. 4A to 4C are views for explaining a stage cleaning process which is performed in the case where a particle is present on the track of the movable stage 35.

It is assumed that a particle 41 is present on the fixed stage 34 as shown in FIG. 4A. This particle appears when the movable stage 35 is floated from the fixed stage 34, or is a particle or the like fallen on the fixed stage 34 after adhering to equipment constituting the sample chamber or equipment in a lens barrel.

The width of the gap between the movable stage 35 and the fixed stage 34 is approximately 10 to 5 [μm] during normal use of the stage, i.e., an electron beam exposure operation. In the case where the height of a particle is smaller than the width of the gap, no problem occurs during the electron beam exposure operation. However, in the case where the height of a particle is approximately equal to the gap width for the stage in use for the exposure operation, the particle may be entangled during movement. This may cause bumpy motion during the movement or halt the movement.

For this reason, in a cleaning operation, the gap between the movable stage 35 and the fixed stage 34 is set to have a width smaller than that for the normal use (electron beam exposure operation) to eliminate particles of such sizes from the track of the movable stage 35. Under this setting, particles 41 are eliminated by moving the movable stage 35.

FIG. 4A shows a state in which the width of the gap between the fixed stage 34 and the movable stage 35 is reduced in the cleaning operation with the movable stage 35 moved to one end (stroke end) of the fixed stage 34. For the normal exposure operation, the floating height is set to approximately 5 [μm]. On the other hand, for the cleaning operation, the floating height is set to, for example, 1 [μm]. Along with this, the width of the gap between the fixed stage 34 and a lower portion of the movable stage 35 becomes greater than that of the normal use (exposure).

FIG. 4B shows a state in which the movable stage 35 is moved to the other end of the fixed stage 34 with the state of air in FIG. 4A maintained. As shown in FIG. 4B, the particle 41 is pushed and moved to an end portion of the fixed stage 34 by the movement of the movable stage 35. In such movement, the movable stage 34 may be reciprocated once or multiple times.

After the cleaning operation described with reference to FIGS. 4A and 4B, as shown in FIG. 4C, the movable stage 35 is moved to a sample stage use position (e.g., a central position of the fixed stage 34), and the width of the gap between the fixed stage 34 and the movable stage 35 is adjusted to a normal width for the electron beam exposure operation.

Incidentally, though the above description has been made on the assumption that the movable stage 35 is moved in only one direction, it is a matter of course that the present invention can be applied to movement in both X- and Y-directions as in an XY stage.

(Stage Cleaning Method)

FIG. 5 is a flowchart showing one example of a stage cleaning process.

First, in step S11, the slider (movable stage) 35 is moved to a stroke end at one end of the range of stage movement.

Then, in step S12, the floating height of the slider 35 is adjusted to be lower than the floating height of the slider 35 for normal exposure. This adjustment is performed by reducing the pressure of air supplied to the air pads 36. By reducing the pressure of air, the width of the gap between a lower surface of the slider 35 and an upper surface of the square shank (fixed stage) 34 is adjusted to, for example, 2 [μm].

Subsequently, in step S13, the slider 35 is moved within the entire range of stage movement. The slider 35 located at one end of the range of stage movement is moved to the other end stroke and then moved to the original end of the range of stage movement again. This causes particles which exist on the track of the air bearing and have heights of more than 2 [μm] to be pushed by a side portion of the slider 35 and moved to the vicinity of the square shank 34.

Next, in step S14, the slider 35 is moved to a basic position (center of the range of stage movement).

After that, in step S15, the floating height of the slider 35 is adjusted to a height for normal use by controlling the pressure regulator 22.

By the above-described stage cleaning process, particles present below the slider 35 are removed. This stage cleaning process may be periodically executed. When the electron beam exposure is carried out after this process, errors due to the stage position are eliminated. Thus, it becomes possible to perform the exposure operation with high position accuracy.

As described above, in the stage device and stage cleaning method of this embodiment, air supplied to the air bearing is regulated so that the width of the gap between the movable stage 35 and the fixed stage 34 may become smaller than that for normal use, and the movable stage 35 is moved within the entire range of the track thereof.

This makes it possible to remove particles present on the track of the movable stage 35 and larger than the gap width for normal use.

(2) Second Embodiment

A stage device and stage cleaning method according to a second embodiment has a function of detecting whether or not there is a particle below the slider 35. If it is determined that there is a particle, stage cleaning is executed.

(Detection of Particle)

Figure 6A:
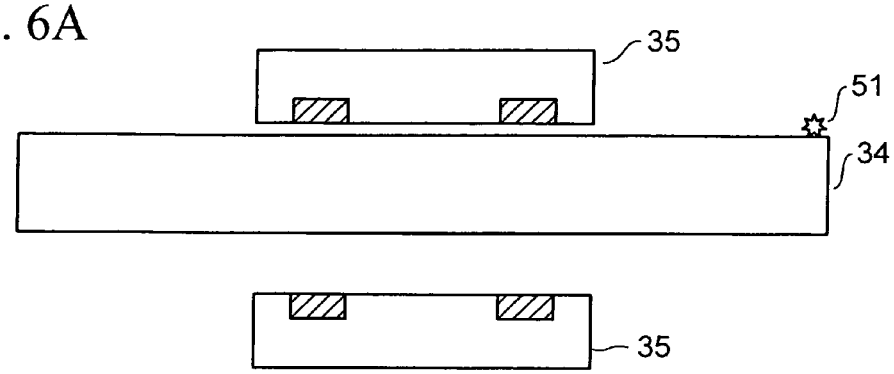
FIGS. 6A to 6C are views for explaining states in which there is a particle on the track of the sample stage device.
Figure 6B:
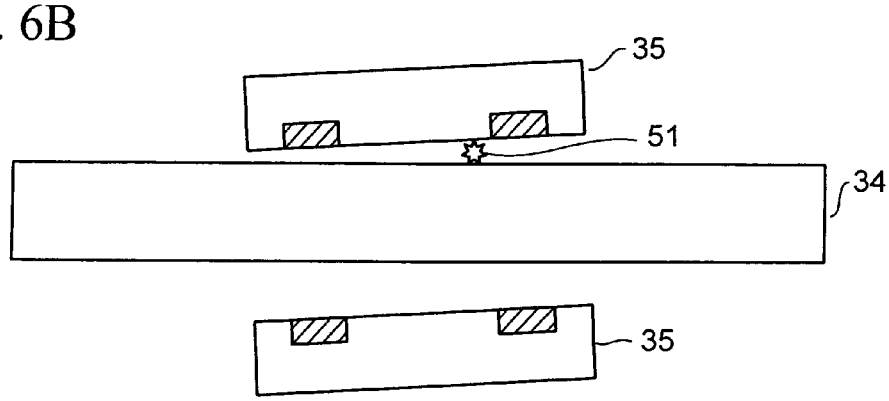
Figure 6C:
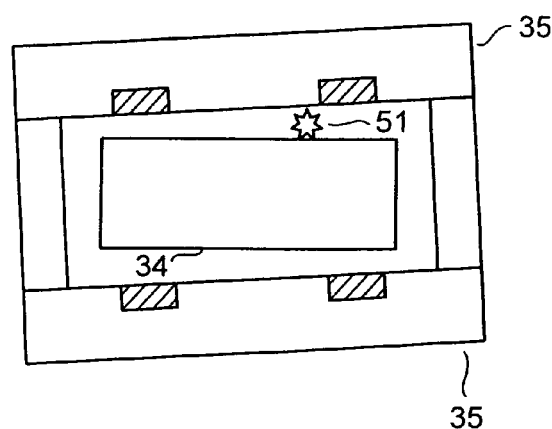

FIGS. 6A to 6C show an example of the case where there is a particle below the movable stage 35. FIGS. 6A to 6C show a state in which the movable stage 35 is at a height less than a normal floating height at a predetermined position (central region). FIG. 6A shows the case where a particle 51 is present at an end portion on the fixed stage 34 and not present under the movable stage 35. In this case, the pitching and rolling of the movable stage 35 do not occur.

FIG. 6B shows an example in which there is a particle under the movable stage 35. In the case where a particle 51 is present under the movable stage 35 as shown in FIG. 6B, the movable stage 35 turns in the direction of movement and is inclined due to pitching. Thus, the movable stage 35 does not maintain its horizontal state anymore FIG. 6C shows an example in which there is a particle under the movable stage 35. The movable stage 35 turns in a direction perpendicular to the direction of movement and is inclined due to rolling. Thus, the movable stage 35 does not maintain its horizontal state anymore.

The above-described pitching and rolling are measured by the laser interferometers 24 provided at positions facing side surfaces of the movable stage 35. The laser interferometer 24 facing a side surface parallel to the direction of movement detects the state of pitching of the movable stage 35, and the laser interferometer 24 facing a side surface parallel to a direction perpendicular to the direction of movement detects the state of rolling of the movable stage 35.

(Stage Cleaning Method)

Figure 7:
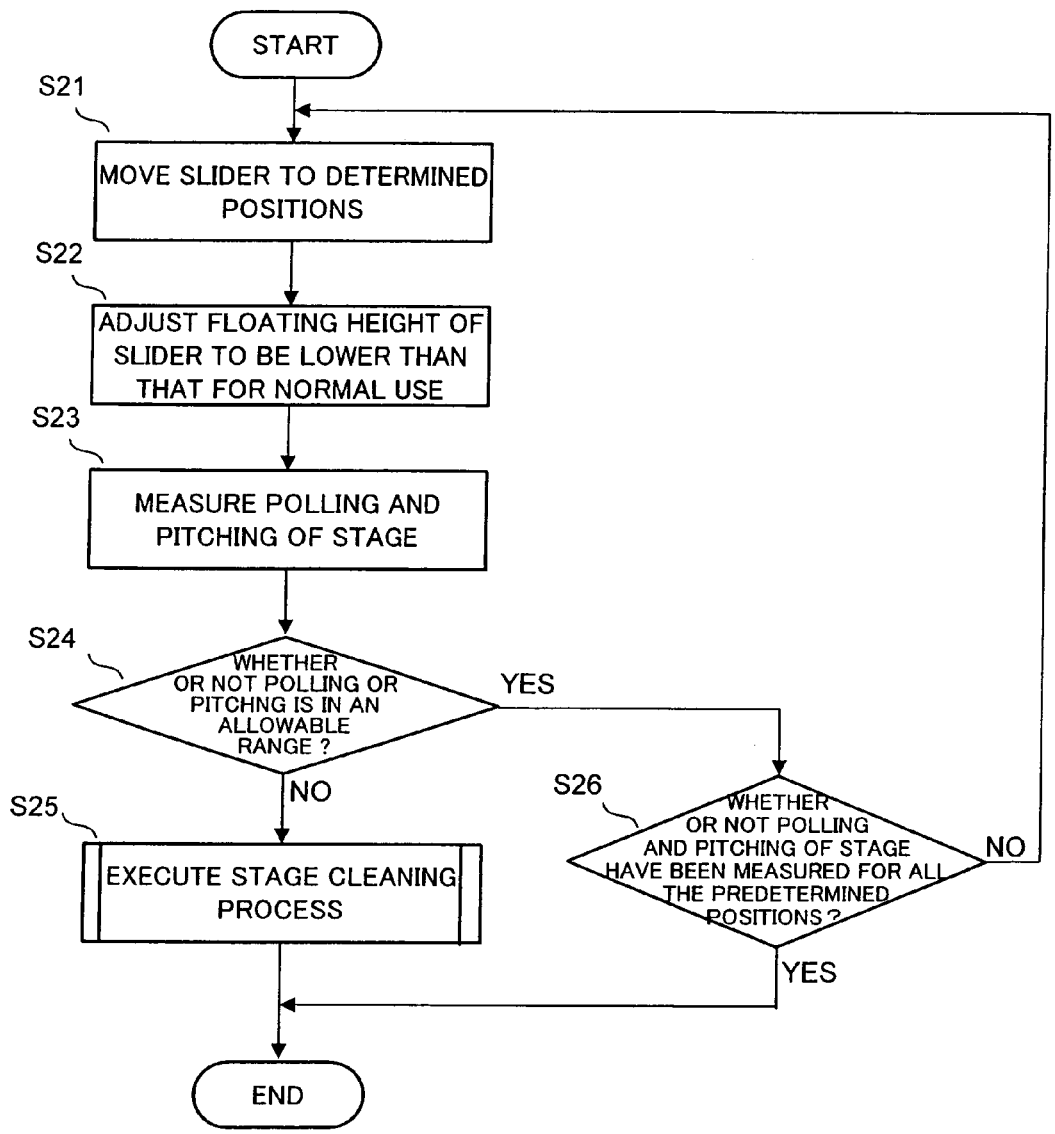
FIG. 7 is a flowchart (part 1) showing one example of a particle detection process in the stage cleaning process for the sample stage device.

FIG. 7 is a flowchart showing one example of a stage cleaning process.

First, in step S21, the slider 35 is moved to predetermined positions. The predetermined positions are, for example, three positions capable of covering the entire range of movement of the slider 35. The slider 35 is moved to one of these three positions.

Then, in step S22, the floating height of the slider 35 is adjusted to be lower than that for normal use.

Subsequently, in step S23, the rolling and pitching of the stage 35 are measured. The rolling and pitching are measured by the laser interferometers 24.

Next, in step S24, a determination is made as to whether or not the rolling or the pitching is in an allowable range. If the rolling or the pitching is not in the range of predetermined allowable values, it is determined that there is a particle under the slider 35. Then, in step S25, a stage cleaning process (cleaning operation) for removing the particle is executed. As described in the first embodiment, this stage cleaning process is performed by moving the slider 35 throughout the entire range of stage movement.

On the other hand, if the rolling or the pitching is within the range of the predetermined values, a particle, if present, does not adversely affect the movement of the stage device using the air bearing. Accordingly, it is determined that there is no particle at that position of the slider 35, and the process goes to step S26.

Then, in step S26, determination is made as to whether or not the rolling and pitching of the stage have been measured for all the predetermined positions. If the rolling and pitching of the stage have not been measured for all the predetermined positions, the process returns to step S21 to repeat the above process for other positions If the rolling and pitching of the stage have been measured for all the predetermined positions, no stage cleaning is needed, and this particle detection and stage cleaning process is terminated.

Incidentally, the vertical position of the stage, instead of the rolling and pitching of the stage, may be detected to determine whether or not there is a particle.

Figure 8:
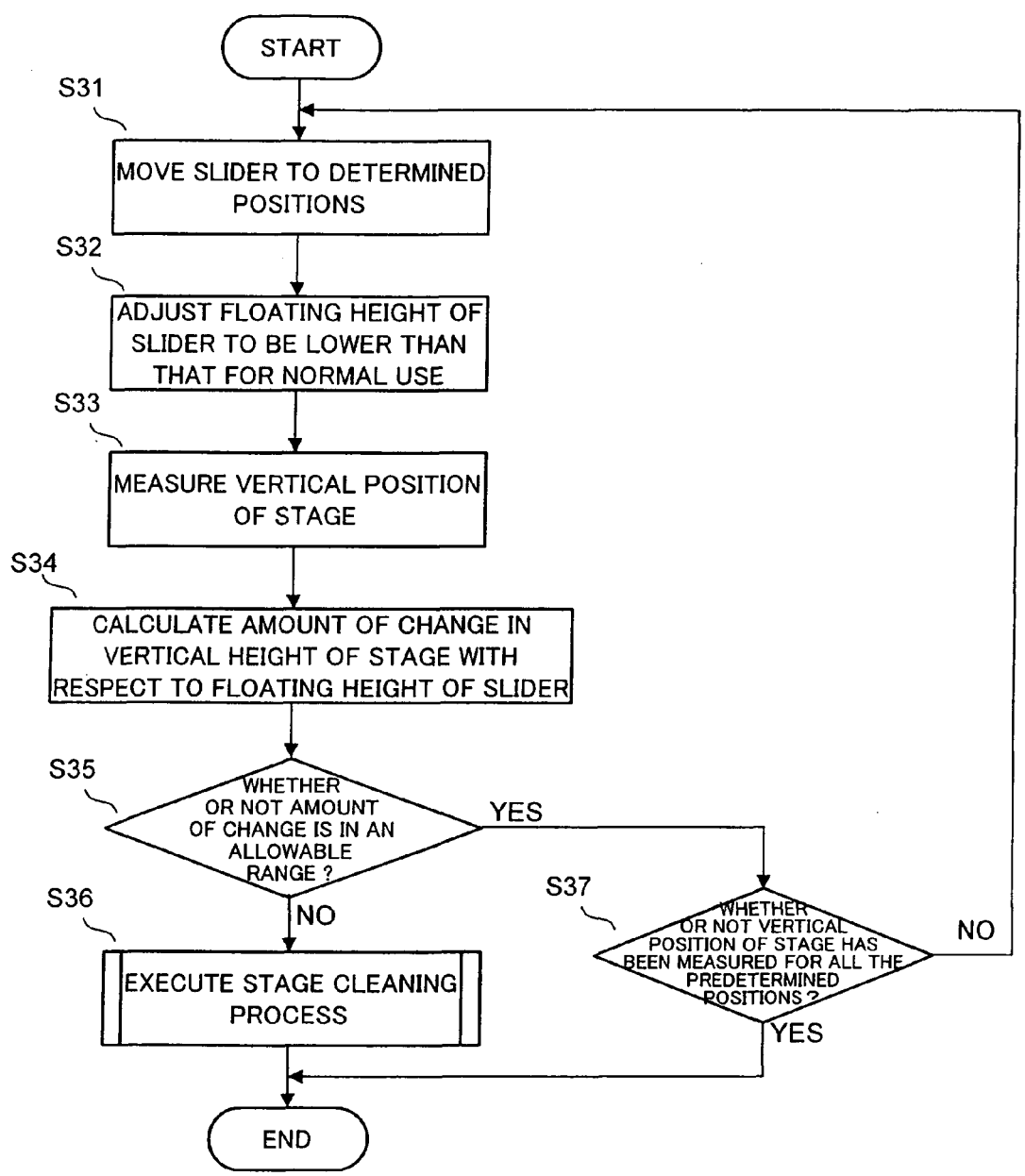
FIG. 8 is a flowchart (part 2) showing one example of a particle detection process in the stage cleaning process for the sample stage device.

FIG. 8 is a flowchart showing one example of a particle detection process which is performed in the case where the vertical position is determined.

First, in step S31, the slider 35 is moved to predetermined positions. The predetermined positions are, for example, three positions capable of covering the entire range of movement of the slider 35. The slider 35 is moved to one of these three positions.

Then, in step S32, the floating height of the slider 35 is adjusted to be lower than that for normal use.

Subsequently, in step S33, the vertical position of the stage (slider 35) is measured. The vertical position of the stage is measured by, for example, the laser interferometer 24 disposed above the slider 35.

Next, in step S34, a calculation is made of the amount of change in the vertical height of the slider 35 with respect to the floating height of the slider 35. A calculation is made of the difference between the vertical position of the slider 35 for normal use and the vertical position of the slider 35 in the case of the lowered floating height.

Then, in step S35, a determination is made as to whether or not the amount of change is in an allowable range. For example, in the case where the floating height is set to a height which is d [μm] lower than that for the normal use of the stage, i.e., the exposure operation, if the amount of change in the vertical position of the slider 35 is also d [μm], it is determined that the slider 35 is correctly lowered. On the other hand, if the amount of change is smaller than d [μm], it is determined that there is some obstacle in the gap between the slider 35 and the fixed stage 34. If the amount of change is not in the range of predetermined allowable values, it is determined that there is a particle under the slider 35. Then, in step S36, a stage cleaning process for removing the particle is executed. As described in the first embodiment, this stage cleaning process is performed by moving the slider 35 throughout the entire range of stage movement.

On the other hand, if the amount of change in the vertical position of the slider 35 is in the range of the predetermined values, a particle, if present, does not adversely affect the movement of the stage device using the air bearing. Accordingly, it is determined that there is no particle at that position of the slider 35, and the process goes to step S37.

Then, in step S37, a determination is made as to whether or not the vertical position of the stage has been measured for all the predetermined positions. If the vertical position of the stage has not been measured for all the predetermined positions, the process returns to step S31 to repeat the above process for other positions. If the vertical position of the stage has been measured for all the predetermined positions, no stage cleaning is needed, and this particle detection and stage cleaning process is terminated.

As described above, in the stage device and stage cleaning method of this embodiment, the pitching and rolling of the movable stage 35 or a change in the vertical position of the movable stage 35 is detected at predetermined positions with the width of the gap between the movable stage 35 and the fixed stage 34 being narrowed by regulating air supplied to the air bearing. When the pitching or rolling of the movable stage 35 is detected, or when a change in the vertical position of the movable stage 35 is detected, stage cleaning is performed.

As a result, stage cleaning only needs to be carried out when necessary, and efficient stage cleaning can be performed.

(3) Third Embodiment

A third embodiment provides a technique adapted to the case where there is a particle which has adhered to the stage so firmly and thus is unremovable by the process of the first embodiment.

Figure 9A:
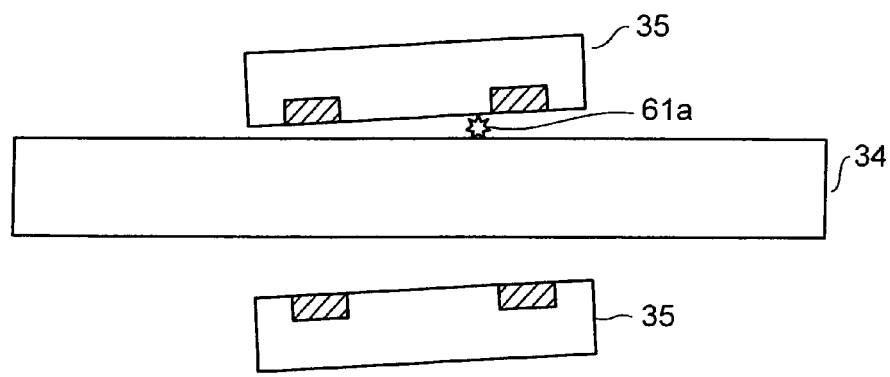
FIGS. 9A to 9C are views (part 2) for explaining cleaning on the track of the sample stage device.
Figure 9B:
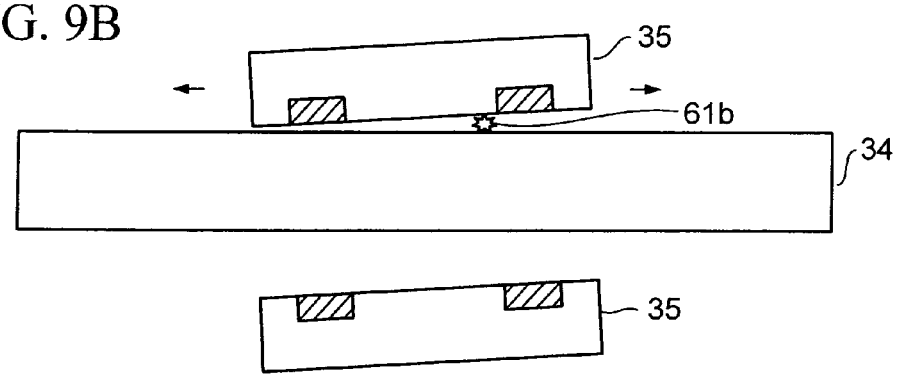
Figure 9C:
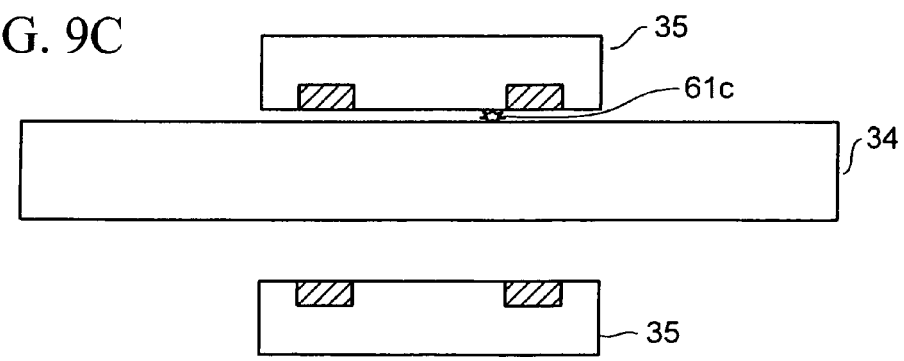

FIGS. 9A to 9C are views for explaining a stage cleaning process which is performed in the case where a particle is present under the movable stage 35.

In the case where a particle which has adhered to the fixed stage 34, the particle may be incapable of being completely removed by a method such as described for the first embodiment in which a particle is pushed out to an end portion of the fixed stage 34 by the movable stage 35, thus remaining on the track. In this case, when the remaining particle is left as it is, the remaining particle may be overlaid with another particle. This may cause a problem during the normal use, i.e., the electron beam exposure operation.

To cope with this, at a position where there is such an adhering particle, the particle is eliminated by making the particle small.

FIG. 9B shows a state in which the movable stage 35 is twice or more reciprocated back and forth in the direction of movement with a short stroke, e.g., a stroke of 10 μm while the condition of air in FIG. 9A is maintained. By reciprocating the movable stage 35 twice or more, a particle 61a is crushed to be as small as particles 61b and 61c. This reciprocating motion is performed until the movable stage 35 becomes horizontal as shown in FIG. 9C.

Whether or not the movable stage 35 becomes horizontal is determined by detecting the attitude of the movable stage 35 using the laser interferometer 24 and making sure that pitching and rolling do not occur.

(Stage Cleaning Method)

Figure 10:
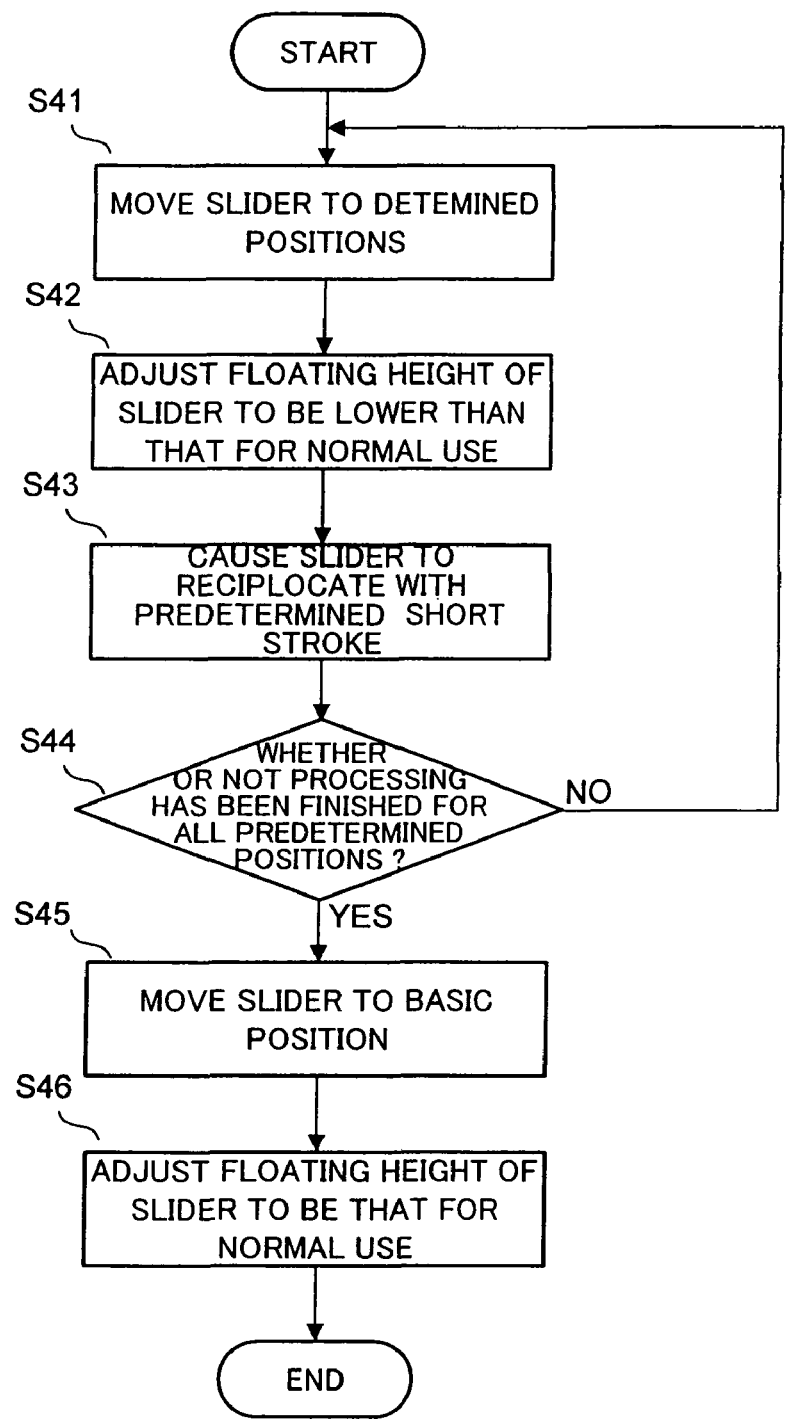
FIG. 10 is a flowchart (part 2) showing one example of a stage cleaning process for the sample stage device.

FIG. 10 is a flowchart showing another example of a stage cleaning process.

First, in step S41, the slider 35 is moved to a predetermined position.

Then, in step S42, the floating height of the slider (movable stage) 35 is adjusted to be lower than that for the normal use (electron beam exposure).

Subsequently, in step S43, the slider is reciprocated with a predetermined short stroke twice or more.

Next, in step S44, a determination is made as to whether or not the processing has been finished for all predetermined positions. If the processing has been finished for all the predetermined positions, the process goes to step S45. If the processing has not been finished for all the predetermined positions, the process goes to step S41 to repeat the above process for the remaining positions.

Then, in step S45, the slider 35 is moved to a basic position.

Subsequently, in step S46, the floating height of the slider 35 is adjusted to be a height for normal use, and this stage cleaning process is terminated.

Incidentally, the stage cleaning process described for the third embodiment may be performed after the particle detection described for the second embodiment. In this case, the stage cleaning process shown in FIG. 10 is executed in the "execution of stage cleaning" in step S25 of FIG. 7 or step S36 of FIG. 8.

As described above, in the stage device and stage cleaning method of this embodiment, the movable stage 35 is reciprocated twice or more within a short distance at a position where there is a particle.

This makes it possible to crush a particle adhering to the fixed stage 34 or the movable stage 35 and to remove a particle present on the track of the air bearing.

(4) Fourth Embodiment

In a fourth embodiment, a particle present on the fixed stage 34 is removed using air for use in the air bearing.

Figure 11A:
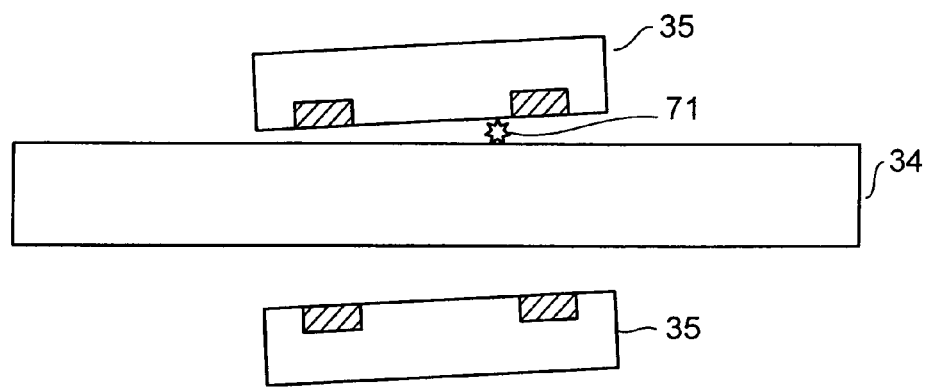
FIGS. 11A and 11B are views (part 3) for explaining cleaning on the track of the sample stage device.

FIG. 11A shows a state in which there is a particle 71 under the movable stage 35. Air supplied to the air bearing is used to remove such a particle from the track of the movable stage 35.

Figure 11B:
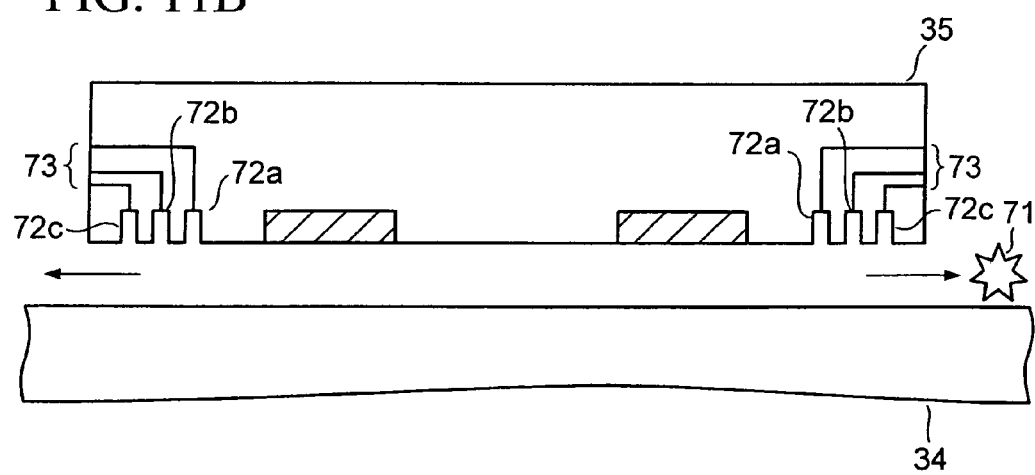

The differential pumping portion 38 is a mechanism for gradually reducing the pressure of air emitted from the air pads 36 so that the air may not flow outside the gap portion between the movable stage 35 and the fixed stage 34. In this embodiment, the pressure placed on the differential pumping portion 38 is adjusted to a high pressure to cause the air to flow outside. For example, air is sucked through exhaust channels 72a, 72b, and 72c into piping 73 as shown in FIG. 11B, and the pressure at the differential pumping portion 38 is increased to be higher than that for the normal use (electron beam exposure operation) by reducing the suction force.

Thus, particles present in the vicinities of both ends of the movable stage 35 are blown away from the gap to the outside. In this state, by moving the movable stage 35 from one end to the other end, particles present on the track are pushed out and moved to end portions of the fixed stage 34.

Incidentally, in this case, since the air in a last stage is emitted, the pressure in a vacuum chamber is increased. Accordingly, it is necessary to isolate an electron gun, which is an electron beam source, in terms of vacuum. Further, since the suction force of each exhaust channel is reduced to increase the pressure of differential pumping to a pressure higher than that for the normal use, i.e., the electron beam exposure operation, particles may flow back from the piping 73 connected to the exhaust channels. Accordingly, it is desirable that a filter for particle back-flow prevention be provided in the piping 73 of the differential pumping portion 38 at a position near the gap portion.

(Stage Cleaning Method)

Figure 12:
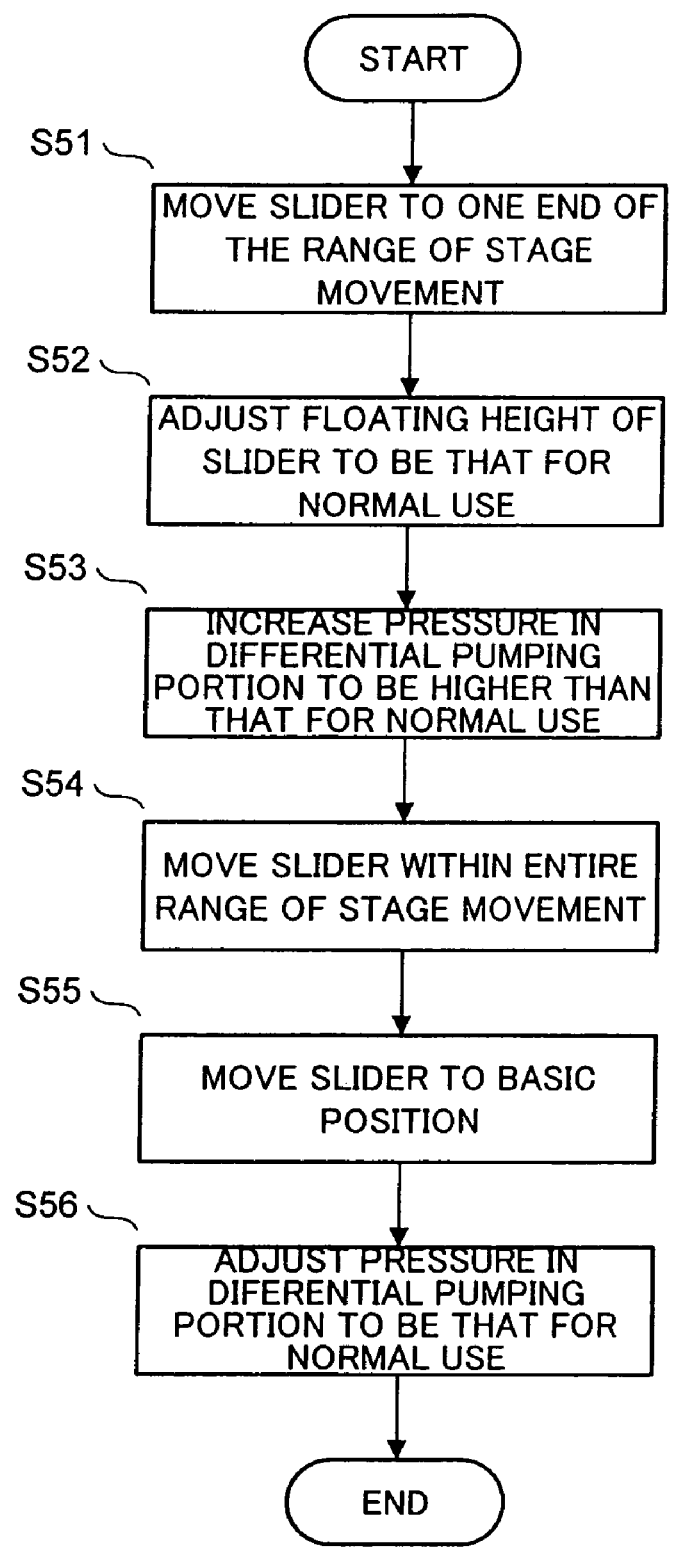
FIG. 12 is a flowchart (part 3) showing one example of a stage cleaning process for the sample stage device.

FIG. 12 is a flowchart showing another example of a stage cleaning process.

First, in step S51, the slider 35 is moved to a stroke end at one end of the range of stage movement.

Then, in step S52, the floating height of the slider 35 is adjusted to that for the normal use. In this adjustment, the floating height is adjusted to, for example, 5 [μm] by setting the pressure of air supplied to the air pads 36 to a pressure for the normal use.

Subsequently, in step S53, the pressure in the differential pumping portion 38 is increased to be higher than that for the normal use. In the normal use, the pressure of air is gradually reduced from atmospheric pressure to $10^{-4}$ [Pa] by the differential pumping portion 38 to prevent the air from flowing out. On the other hand, the suction forces of the exhaust channels 72a to 72c are adjusted to allow the air to have such a pressure that the air flows to the outside.

Next, in step S54, the slider 35 is moved throughout the entire range of stage movement. The slider 35 located at one end of the range of stage movement is moved to the other end stroke and then moved to the original end of the range of stage movement again. Thus, particles present on the track of the air bearing are blown away by the air to be removed from the course.

Then, in step S55, the slider 35 is moved to a basic position.

Subsequently, in step S56, the pressure in the differential pumping portion 38 is adjusted to a pressure for normal use, and this stage cleaning process is terminated.

Incidentally, the stage cleaning process described for the fourth embodiment may be performed after the particle detection described for the second embodiment. In this case, the stage cleaning process shown in FIG. 12 is executed in the "execution of stage cleaning" in step S25 of FIG. 7 or step S36 of FIG. 8.

As described above, in the stage device and stage cleaning method of this embodiment, stage cleaning is performed by moving the movable stage 35 throughout the entire range of the track thereof with the width of the gap between the movable stage 35 and the fixed stage 34 being set to a width for the normal use (electron beam exposure operation) of the stage device and with the pressure on the differential pumping portion 38 of the air bearing being increased.

This makes it possible to remove particles present on the track of the movable stage 35.

It should be noted that the present invention is a patent application (patent application to which Article 19 of the Industrial Technology Enhancement Act of Japan is applied) pertaining to the result of research (research in a project named "Development of Comprehensive Optimization Technologies to Improve Mask Design, Drawing and Inspection," entrusted by New Energy and Industrial Technology Development Organization in fiscal year 2008) entrusted by the Japanese national government or the like.

What is claimed is:

1. A stage device for use in an electron beam exposure system, comprising:

a gas supply unit to generate gas;

a pressure regulator to regulate a pressure of the gas;

a frame-shaped movable stage having a sample mounting surface;

a fixed stage having a surface facing an opposite surface of the movable stage from the sample mounting surface, the fixed stage being surrounded by the movable stage;

an air bearing to float the movable stage by supplying the gas to a gap portion between the fixed stage and the movable stage;

a differential pumping portion to prevent the gas from flowing outside the gap portion between the movable stage and the fixed stage; and a controller to control the gas supply unit, the pressure regulator, the movable stage, and the differential pumping portion, in a cleaning operation and in an electron beam exposure operation;

wherein the controller controls the cleaning operation by moving the movable stage within a predetermined range and regulating the pressure of the gas supplied to the air bearing via the pressure regulator; and wherein the floating height of the movable stage in the cleaning operation is set lower than that in the electron beam exposure operation and the pressure in the differential pumping portion in the cleaning operation is set equal to that in the electron beam exposure operation, or the floating height of the movable stage in the cleaning operation is set equal to that in electron beam exposure operation and the pressure in the differential pumping portion in the cleaning operation is set higher than that in the electron beam exposure operation.

2. The stage device according to claim 1, further comprising:

an interferometer to detect a position of the movable stage, wherein, in the cleaning operation, rolling and pitching of the movable stage is measured based on the position detected by the interferometer and it is determined that a particle exists on the track of the air bearing if a value of any of the rolling and pitching exceeds a predetermined value.

3. The stage device according to claim 2, further comprising:

a vertical position detector to detect a vertical position of the movable stage, wherein, in the cleaning operation, a change in the vertical position of the movable stage with respect to a change in a pressure for supplying the gas is measured based on the vertical position detected by the vertical position detector and it is determined that a particle exists on the track of the air bearing if the change in the vertical position is out of a predetermined allowable value range.

4. The stage device according to claim 1, wherein the controller is configured to move the movable stage from one end of the fixed stage to an opposite end of the fixed stage at least once in the cleaning operation.

5. The stage device according to claim 1, wherein the controller is configured to reciprocate the movable stage with a short stroke of 10 µm or less around the predetermined position twice or more in the cleaning operation.

6. The stage device according to claim 1, further comprising a back-flow prevention filter in piping of the differential pumping portion on a side near the gap portion.

* * * * *